United States Patent
Skofljanec

(10) Patent No.: US 6,362,971 B1
(45) Date of Patent: Mar. 26, 2002

(54) CONTROL DEVICE FOR A VEHICULAR OCCUPANT RESTRAINT SYSTEM

(75) Inventor: Robert Skofljanec, Moos-Bankholzen (DE)

(73) Assignee: TRW Automotive Electronics & Components GmbH & Co.KG, Radolfzell (DE)

( * ) Notice: Subject to any disclaimer, the term of this patent is extended or adjusted under 35 U.S.C. 154(b) by 0 days.

(21) Appl. No.: 09/696,795

(22) Filed: Oct. 25, 2000

(30) Foreign Application Priority Data

Oct. 27, 1999 (DE) ..................... 299 18 914 U

(51) Int. Cl.⁷ ............................... H01H 35/14
(52) U.S. Cl. ................. 361/752; 280/735; 361/796
(58) Field of Search ................ 307/10.1; 439/76.1; 701/45, 49; 280/735; 361/679, 752, 753, 756, 724–728, 796, 801, 802

(56) References Cited

U.S. PATENT DOCUMENTS

| | | | | |
|---|---|---|---|---|
| 4,130,856 A | * | 12/1978 | Crall et al. | 361/796 |
| 4,149,027 A | * | 4/1979 | Asher et al. | 463/44 |
| 5,322,325 A | * | 6/1994 | Breed et al. | 280/735 |
| 5,505,483 A | * | 4/1996 | Taguchi et al. | 280/728.2 |
| 5,657,203 A | * | 8/1997 | Hirao et al. | 361/707 |
| 6,213,495 B1 | * | 4/2001 | Plankl et al. | 280/728.2 |
| 6,236,920 B1 | * | 5/2001 | Hora | 701/45 |

FOREIGN PATENT DOCUMENTS

| | | |
|---|---|---|
| DE | 3837974 | 5/1990 |
| DE | 4300342 | 7/1994 |
| DE | 19515622 | 11/1996 |
| DE | 29617603 | 3/1997 |
| DE | 19544974 | 5/1997 |
| DE | 19604614 | 8/1997 |
| DE | 19811610 | 8/1999 |
| EP | 0854667 | 7/1998 |

* cited by examiner

*Primary Examiner*—Gerald Tolin
(74) *Attorney, Agent, or Firm*—Tarolli, Sundheim, Covell, Tummino & Szabo L.L.P.

(57) ABSTRACT

The invention relates to a control device for a vehicular occupant restraint system comprising a housing with a metallic baseplate and an electronic module including an acceleration sensor and being mounted on a circuit board. The electronic module is insertable into the housing that is formed as a composite of an injection-molded plastic body and the metallic baseplate part of which is embedded in an injection molded wall of plastic.

21 Claims, 3 Drawing Sheets

CONTROL DEVICE FOR A VEHICULAR OCCUPANT RESTRAINT SYSTEM

FIELD OF THE INVENTION

The invention relates to a control device for a vehicular occupant restraint system.

BACKGROUND OF THE INVENTION

Safe and reliable functioning of such a control device is vital to the effectiveness of the restraint systems, such as belt tensioner and air bag connected thereto. The housing of such a control device has therefore to ensure safe protection against any interference that may affect the functioning of the electronic module. In addition, however, the housing rigidly bolted to the vehicle body is required to transfer the deceleration actions occurring an impact of the vehicle as directly as possible to the acceleration sensor of the electronic module. Therefore, solid metal housings, in particular heavy diecast housings made of aluminium, are used. Instead of metal housings, plastic housings have already been proposed provided at the attachment locations with metal fastening bushes embedded in an injection molded plastic material, since plastic materials fail to withstand the bolting pressure. However, the stiffness and rigidity of such a housing design is only just satisfactory.

BRIEF SUMMARY OF THE INVENTION

This is achieved in a control device for a vehicular occupant restraint system comprising a housing with a metallic baseplate and an electronic module including an acceleration sensor and being mounted on a circuit board. The electronic module is insertable into the housing that is formed as a composite of an injection-molded plastic body and the metallic baseplate part of which is embedded in an injection molded wall of plastic.

The housing of the control device combines the mechanical advantages of a metal design with the production engineering and cost advantages of a plastic design. According to the invention the metallic baseplate ensures a rigid coupling to the vehicle body. Since the circuit on which the acceleration sensor is mounted is arranged directly above the baseplate a direct momentum transfer from the baseplate to the acceleration sensor is assured. In addition, due to the baseplate being metallic the fastening points are precisely defined unlike a plastic design of the housing with fastening bushes embedded in the injection molded plastic material, the distances between which vary due to shrinkage of the plastic material. As compared to a design including fastening bushes embedded in the injection molded plastic material the solution in accordance with the invention has furthermore the advantage of facilitated fabrication since inserting the metallic baseplate in the plastic mold can be carried out much easier than correctly locating individual fastening bushes.

In the preferred embodiment the metallic baseplate is electrically connected to the ground of the circuit board. Serving this purpose is an electrically conducting link which may be provided in differing variants and which leads from the baseplate to a contact pin or contact tag on a plug socket and from there to the circuit board.

In one advantageous embodiment a mechanically solid and rigid connection between the metallic baseplate and the plastic body of the housing is achieved by providing a plurality of through-holes in the baseplate which are filled in a form-fitting manner by the plastic compound. As an alternative or in addition thereto the baseplate comprises a plurality of projected stamped tabs embedded in the plastic material. In the preferred embodiment the baseplate is furthermore flush with the outer bottom surface area of the housing, but is covered on the inside by a film of plastic so that the baseplate is ultimately inset in the bottom wall of the housing body.

According to a further embodiment of the invention the metallic baseplate takes up only part of the bottom surface area of the housing, more particularly half of the bottom surface area of the housing as defined by a diagonal line. It has been discovered that even in such a material and weight-saving design of the housing a sufficiently rigid connection and good mechanical coupling between the baseplate and acceleration sensor are assured.

BRIEF DESCRIPTION OF THE DRAWINGS

Further advantages and features of the invention will become apparent from the following description of several embodiments as well as from the drawings to which reference is made and in which.

DETAILED DESCRIPTION OF THE INVENTION

Figure 1:
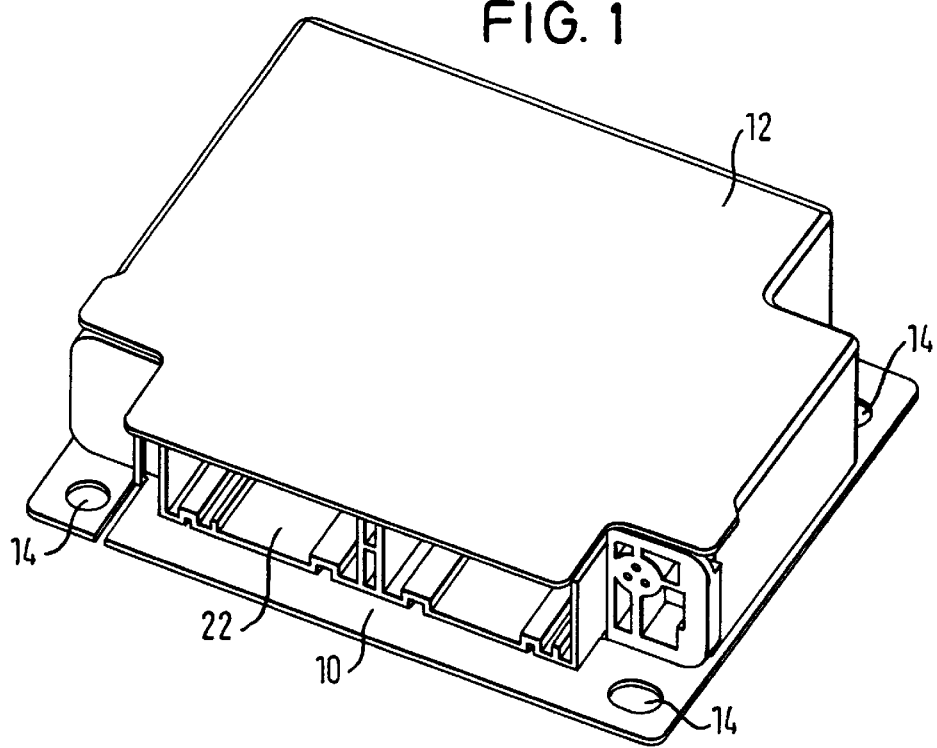
FIG. 1 is a slanting view in perspective of the control device as seen from above.
Figure 2:
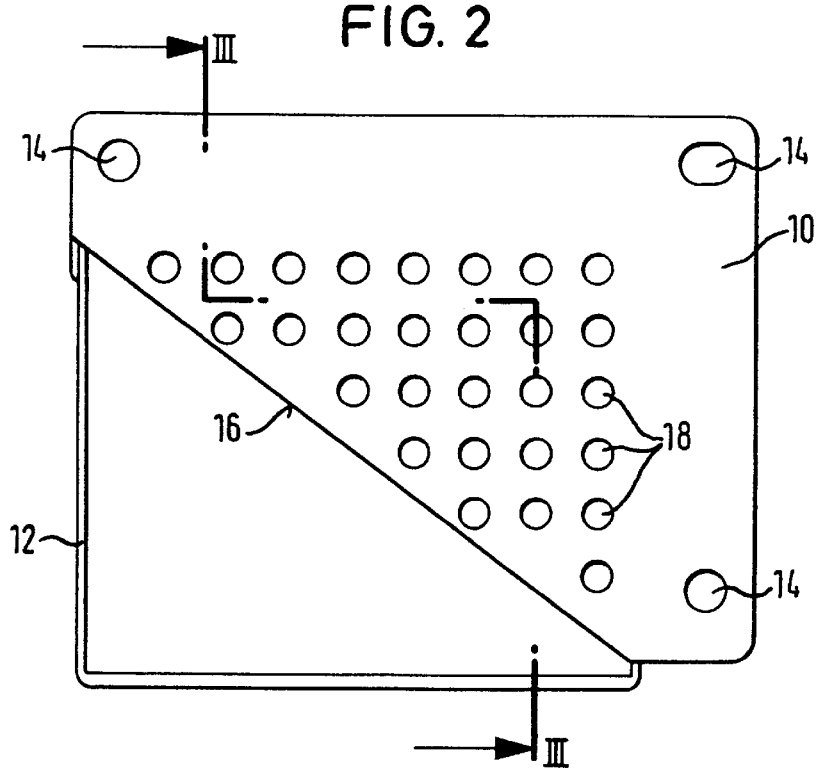
FIG. 2 is a plan view of the baseplate of the housing as seen from underneath.

The housing of the control device comprises a flat metal baseplate 10 and a hood-shaped plastic body 12 of a generally parallelepipedal form. The baseplate 10 has edge strips protruding beyond the plastic body 12 having arranged fastening holes 14 at the three corners. As evident from FIG. 2 the baseplate 10 takes up only part of the bottom surface area of the bottom wall of the housing. The portion of the bottom surface area of the bottom wall taken up by the baseplate 10 is defined by a diagonal line 16, the baseplate 10 thus taking up only roughly half the bottom surface area of the bottom wall.

Figure 3:
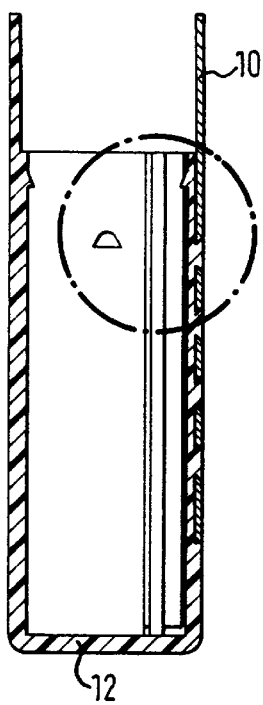
FIG. 3 is a sectional view taken along the line III—III in FIG. 2.
Figure 4:
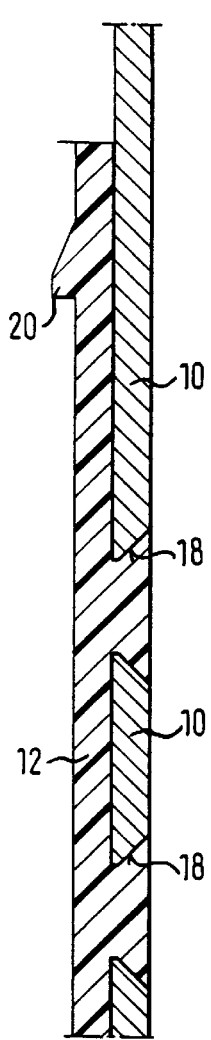
FIG. 4 is a detail on a magnified scale as shown in FIG. 3.

Fabricating the housing is done by injection-molding it in a mold in which the baseplate 10 has been inserted prior. The baseplate 10 has a plurality of through-holes 18 flared conically towards the outer surface of the bottom wall. Referring now to FIGS. 3 and 4 there is illustrated how the baseplate 10 is brought into composite with the plastic body of the housing in injection-molding. The baseplate 10 coincides on the outside with the bottom surface area of the housing. On the inside the baseplate 10 is coated with a film of plastic having a thickness that corresponds roughly to the thickness of the baseplate. The through-holes 18 in the baseplate 10 are positively filled by the plastic material. As an alternative or in addition thereto the baseplate comprises a plurality of stamped-out and inwardly bent tabs 19 (FIG.

10) embedded in the plastic material. Molded to the inside of the plastic body 12 are latching keys 20 or latching notches, whose functioning is explained next.

The housing has an open narrow side into which a frame-type plug socket 22 of plastic is inserted to thus close off this open side of the housing. The plug socket 22 is connected by a plurality of contact pins and by latching means to a circuit board 23 (FIG. 9) onto which the electronic module of the control device including an acceleration sensor is mounted. The complete electronic module comprising plug socket 22 and circuit board 23 is inserted into the housing, the circuit board being received by guide slots incorporated on the inside of the housing. Due to the latching keys 20 molded to the inside of the housing and engaging the plug socket 22 the electronic module is reliably locked in place in the housing. The housing is sealed by a silicone rubber sealing ring at the transition to the plug socket 22. As an alternative latching keys are molded on the plug socket 22 and the housing comprises corresponding latching notches.

To produce an electrical connection between the baseplate and ground on the circuit board of the electronic module an electrically conducting link is provided, four variants of which are apparent from FIGS. 5 to 8.

Figure 5:
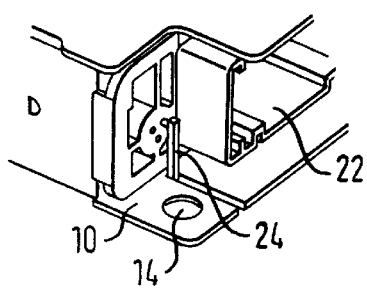
FIGS. 5 to 8 show different embodiments of an electrical ground link between the baseplate of the housing and a contact pin connected to the circuit board of the electronic module.

In the embodiment as shown in FIG. 5 a tab 24 is stamped out and bent upwards at right angles from the baseplate 10 alongside one of the fastening holes 14. The free end of this tab 24 is connected to the end of a contact pin, for example, by welding or soldering, the contact pin passing through the plug socket 22 and is soldered on the inside to the circuit board.

Figure 6:
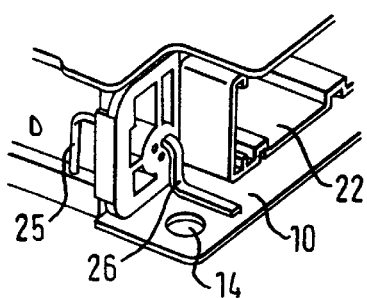

In the embodiment as shown in FIG. 6 a contact pin 25 soldered to the circuit board passes through the plug socket 22 and is bent as a contact strap 26 towards the baseplate where it is secured in full contact, for example, by welding or soldering.

Figure 7:
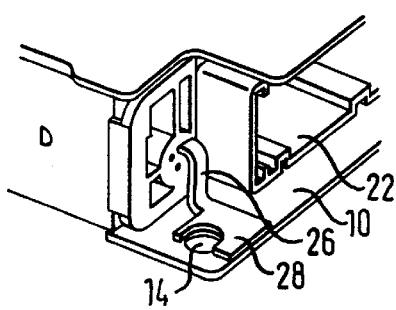

In the embodiment as shown in FIG. 7 the end of the contact strap 26 is configured as a contact lug 28 made to coincide with a fastening hole 14 fully or partly and is clamped in place between screw head and baseplate 10 in being screw-fastened.

Figure 8:
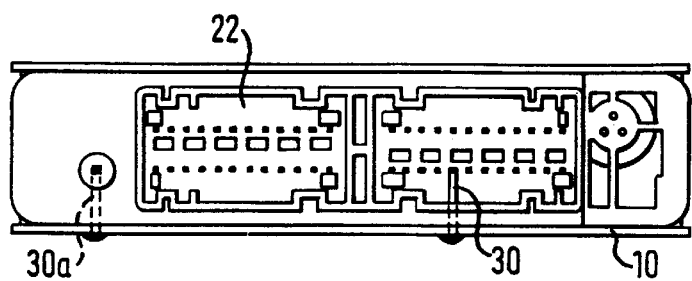

In the embodiment as shown in FIG. 8 a contact pin 30 is secured by its free end to the baseplate 10 by welding or soldering, the other end of the contact pin 30 being connected to a contact pin jutting out from the plug socket 22. The contact pin 30 forms at the same time a mechanical lock making it difficult for the plug socket 22 to become loose from the housing. As an alternative, as shown in FIG. 8, another arrangement of the contact pin is shown at 30a. Several such contact pins may also be provided.

Figure 9:
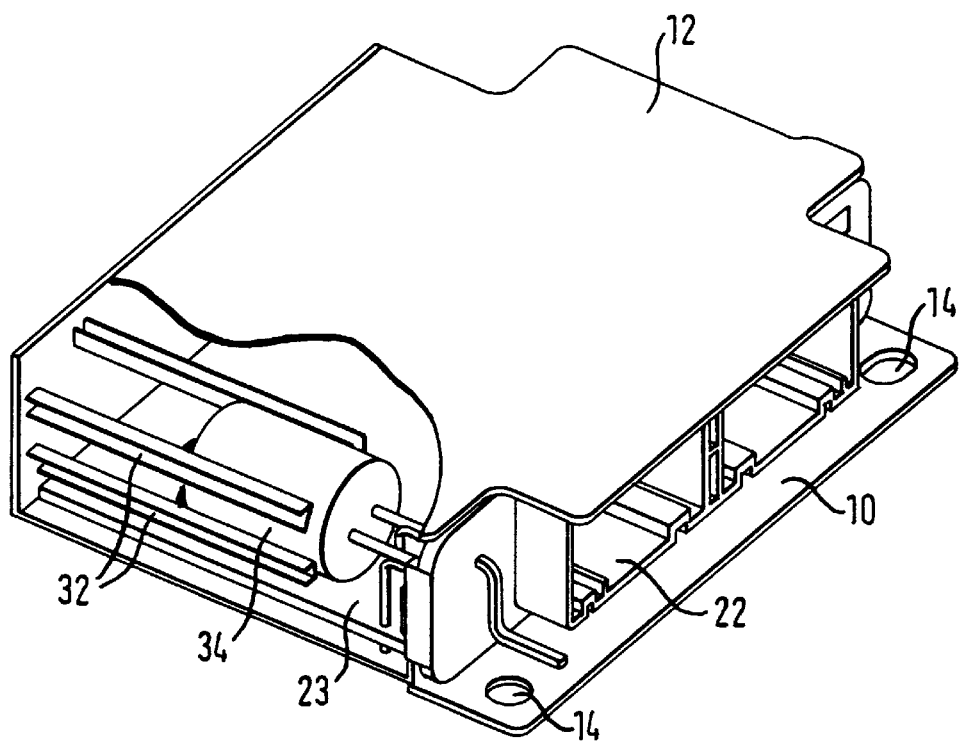
FIG. 9 is a partly sectioned view in perspective of an advantageous further embodiment.
Figure 10:
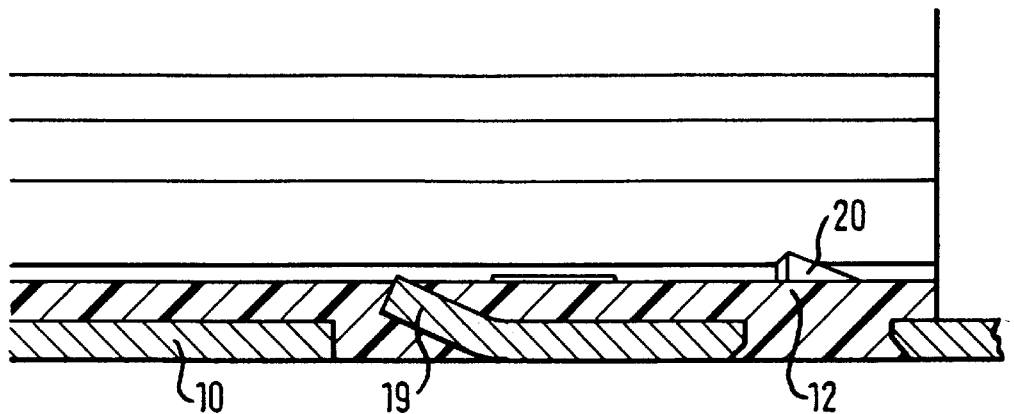
FIG. 10 is a detail view of the bottom portion of the housing.

In a further embodiment of the control device as shown in FIG. 9 guide and supporting rails 32 are molded on the inside of the plastic body 12 of the housing, these rails extending in the plug-in direction of the electronic module comprising the circuit board 23 with the plug socket 22. Insertable between these guide and supporting rails 32 is a component 34 such as a cylindrical capacitor. This component 34 is mounted freely supported on the plug socket 22 or on the circuit board 23 as well as being electrically in contact therewith and first receives support by the guide and supporting rails 32 load-bearingly in the housing and locked in place.

What is claimed is:

1. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material closing the bottom of said injection molded plastic body, said electronic module being mounted on said circuit board and being inserted into said housing, said housing being formed as a composite of said injection-molded plastic body and of said metallic baseplate, and at least part of said metallic baseplate being embedded in said injection molded bottom wall.

2. The control device as set forth in claim 1 wherein said bottom wall has an outer bottom surface area and said baseplate is flush with said outer bottom surface area of said bottom wall.

3. The control device as set forth in claim 1 wherein said metallic baseplate takes up only part of said bottom surface area of said bottom wall.

4. The control device as set forth in claim 3 wherein said baseplate takes up substantially half of said bottom surface area of said bottom wall as defined by a diagonal line.

5. The control device as set forth in claim 1 having an open narrow side wherein said open narrow side of said housing is closed off by a plug socket connected to said circuit board.

6. The control device as set forth in claim 5 wherein said plug socket is locked in place by latching elements molded to the inside of said housing.

7. The control device as set forth in claim 1 wherein guide grooves for said circuit board are incorporated on the inside of said opposing narrow sidewalls of said housing.

8. The control device as set forth in claim 1 wherein said baseplate protrudes beyond said housing on two sides defining a pair of edge strips.

9. The control device as set forth in claim 1 wherein said baseplate comprises fastening holes in said edge strips.

10. The control device as set forth in claim 1 wherein an electrically conducting link is provided between said baseplate and said circuit board.

11. The control device as set forth in claim 1 wherein said plastic body is reinforced by a fiber material such as glass fibers.

12. The control device as set forth in claim 1 wherein guiding and retaining structures are molded on the inside of said plastic body of said housing for at least one component which is connected electrically to said circuit board.

13. The control device as set forth in claim 1 wherein guiding and retaining structures are molded on the inside of said plastic body of said housing for at least one component which is connected electrically to a plug socket, said plug socket closing off said narrow side of said housing.

14. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, said baseplate comprising a plurality of through-holes filled with said plastic material.

15. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, said baseplate comprising a plurality of through-holes filled with said plastic material, said through-holes of said baseplate being flared outwardly.

16. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, said baseplate comprising a plurality of stamped-out and inwardly bent tabs embedded in said plastic material.

17. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, an electrically conducting link being provided between said baseplate and said circuit board, said electrically conducting link being formed by a tab stamped out from said baseplate and bent towards said circuit board.

18. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, an electrically conducting link being provided between said baseplate and said circuit board, said electrically conducting link being formed by a tab stamped out from said baseplate and bent towards said circuit board, said tab being connected to a contact pin protruding from a plug socket connected to said circuit board.

19. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, an electrically conducting link being provided between said baseplate and said circuit board, said electrically conducting link being formed by a tab stamped out from said baseplate and bent towards said circuit board, said tab being connected to a contact pin protruding from a plug socket connected to said circuit board, said link being formed by a contact pin passing through said baseplate and said plug socket, said contact pin being directly connected to said circuit board.

20. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, and at least part of said metallic baseplate being embedded in said injection molded bottom wall, an electrically conducting link is provided between said baseplate and said circuit board, said electrically conducting link being formed by a tab stamped out from said baseplate and bent towards said circuit board, said tab being connected to a contact pin protruding from a plug socket connected to said circuit board, said link being formed by a contact strap guided from said baseplate through said plug socket into the interior of said housing up to said circuit board.

21. A control device for a vehicular occupant restraint system, which comprises:
   (a) a housing having a metallic baseplate;
   (b) an injection molded plastic body;
   (c) a circuit board;
   (d) an electronic module including an acceleration sensor; and
   (e) an injection molded bottom wall of plastic material, said electronic module being mounted on said circuit board and being inserted into said housing, said housing being formed as a composite of said injection-molded plastic body and of said metallic baseplate, at least part of said metallic baseplate being embedded in said injection molded bottom wall, said bottom wall having an outer bottom surface area and said baseplate being flush with said outer bottom surface area of said bottom wall.

* * * * *